(12) United States Patent
Chang et al.

(10) Patent No.: US 11,081,353 B2
(45) Date of Patent: Aug. 3, 2021

(54) SEMICONDUCTOR DEVICE AND MANUFACTURING METHOD THEREOF

(71) Applicants: UNITED MICROELECTRONICS CORP., Hsin-Chu (TW); Fujian Jinhua Integrated Circuit Co., Ltd., Quanzhou (CN)

(72) Inventors: Feng-Yi Chang, Tainan (TW); Fu-Che Lee, Taichung (TW); Yu-Cheng Tung, Kaohsiung (TW)

(73) Assignees: UNITED MICROELECTRONICS CORP., Hsin-Chu (TW); Fujian Jinhua Integrated Circuit Co., Ltd., Quanzhou (CN)

(*) Notice: Subject to any disclaimer, the term of this patent is extended or adjusted under 35 U.S.C. 154(b) by 0 days.

(21) Appl. No.: 16/174,237

(22) Filed: Oct. 29, 2018

(65) Prior Publication Data

US 2020/0118812 A1 Apr. 16, 2020

(30) Foreign Application Priority Data

Oct. 11, 2018 (CN) .......................... 201811182653.0

(51) Int. Cl.
*H01L 21/027* (2006.01)
*H01L 21/033* (2006.01)
*G03F 7/26* (2006.01)
*H01L 27/108* (2006.01)
*G03F 7/16* (2006.01)
*G03F 7/20* (2006.01)

(52) U.S. Cl.
CPC ............ *H01L 21/0276* (2013.01); *G03F 7/16* (2013.01); *G03F 7/20* (2013.01); *G03F 7/26* (2013.01); *H01L 21/0332* (2013.01); *H01L 21/0335* (2013.01); *H01L 21/0337* (2013.01); *H01L 27/10823* (2013.01)

(58) Field of Classification Search
CPC ............ H01L 21/0276; H01L 21/0332; H01L 21/0335; H01L 21/0337; H01L 27/10823; G03F 7/16; G03F 7/20; G03F 7/26
USPC .......................................... 257/296
See application file for complete search history.

(56) References Cited

U.S. PATENT DOCUMENTS

| | | | |
|---|---|---|---|
| 9,837,272 B2 | 12/2017 | Park | |
| 2007/0197014 A1* | 8/2007 | Jeon | .................... H01L 21/0337 438/597 |
| 2011/0171815 A1* | 7/2011 | Nguyen | .............. H01L 21/0274 438/478 |
| 2012/0329282 A1* | 12/2012 | Chang | ............... H01L 21/76807 438/703 |

(Continued)

*Primary Examiner* — Dzung Tran
(74) *Attorney, Agent, or Firm* — Winston Hsu

(57) ABSTRACT

A method of manufacturing a semiconductor device includes the following steps. A first patterned photoresist layer is formed on a substrate. A second patterned photoresist layer is formed on the substrate after the first patterned photoresist layer is formed, wherein the first patterned photoresist layer and the second patterned photoresist layer are arranged alternatively. A liner is formed to cover sidewalls of the first patterned photoresist layer and the second patterned photoresist layer. The present invention also provides a semiconductor device, including a plurality of pillars being disposed on a layer, wherein the layer includes first recesses and second recesses, wherein the depths of the first recesses are less than the depths of the second recesses.

11 Claims, 9 Drawing Sheets

(56) References Cited

U.S. PATENT DOCUMENTS

| | | | |
|---|---|---|---|
| 2014/0273441 A1* | 9/2014 | Kim | H01L 21/283 438/666 |
| 2014/0273473 A1* | 9/2014 | Schmid | H01L 21/76813 438/703 |
| 2015/0126042 A1* | 5/2015 | Pasquale | C23C 16/402 438/761 |
| 2016/0005615 A1* | 1/2016 | Lee | H01L 21/3086 438/666 |

* cited by examiner

SEMICONDUCTOR DEVICE AND MANUFACTURING METHOD THEREOF

BACKGROUND OF THE INVENTION

1. Field of the Invention

The present invention relates generally to a semiconductor device and manufacturing method thereof, and more specifically to a semiconductor device and manufacturing method thereof applying photoresists.

2. Description of the Prior Art

Photolithography is an essential process in the fabrication of semiconductor ICs. Principally, the photolithography is to form designed patterns such as implantation patterns or layout patterns on at least a photomask, and then to precisely transfer such patterns to a photoresist layer by exposure and development steps. Subsequently, by performing semiconductor processes such as ion implantation, etching process, or deposition, the complicated and sophisticated IC structure is obtained.

Along with miniaturization of semiconductor devices and progress in fabrication of semiconductor device, conventional lithography process meets the bottleneck due to printability and manufacturability. To meet the requirements of device design rules which continue to push the resolution limits of existing processes and tooling, double patterning technique (DPT) is developed and taken as one of the most promising lithography technologies for 32 nanometer (nm) node and 22 nm node patterning since it can increase the half-pitch resolution by up to two times using current infrastructures.

SUMMARY OF THE INVENTION

The present invention provides a semiconductor device and manufacturing method thereof, which forms photoresist layers several times and then etching once to shrink gaps between formed patterns.

The present invention provides a method of manufacturing a semiconductor device including the following steps. A first patterned photoresist layer is formed on a substrate. A second patterned photoresist layer is formed on the substrate after the first patterned photoresist layer is formed, wherein the first patterned photoresist layer and the second patterned photoresist layer are arranged alternatively. A liner is formed to cover sidewalls of the first patterned photoresist layer and the second patterned photoresist layer.

The present invention provides a semiconductor device, including a plurality of pillars being disposed on a layer, wherein the layer includes first recesses and second recesses, wherein the depths of the first recesses are less than the depths of the second recesses.

The present invention provides a semiconductor device, including a plurality of hole structures being disposed on a layer, wherein the layer includes first holes and second holes, wherein the depths of the first holes are less than the depths of the second holes.

According to the above, the present invention provides a semiconductor device and manufacturing method thereof, which forms a first patterned photoresist layer and a second patterned photoresist layer on a substrate sequentially, and then forms a liner covering sidewalls of the first patterned photoresist layer and the second patterned photoresist layer. Therefore, pattern precision can be increased by forming photoresists many times (or respectively). Furthermore, patterns can be formed more precisely than only coating photoresists by forming the liner surrounding the first patterned photoresist layer and the second patterned photoresist layer.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
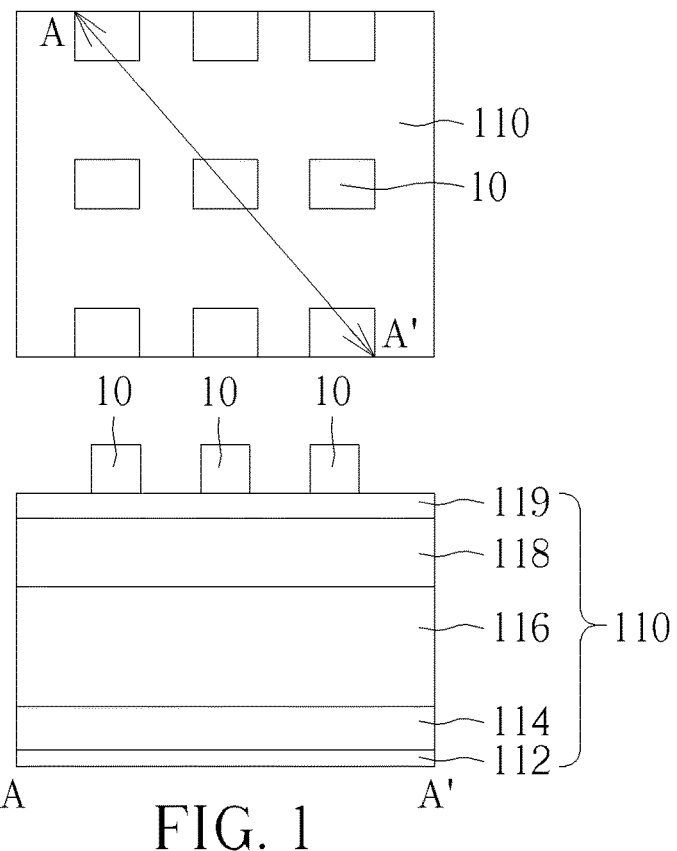
FIG. 1 schematically depicts a top view and a cross-sectional view of a method of manufacturing a semiconductor device according to an embodiment of the present invention.

FIGS. 1-4 schematically depicts top views and cross-sectional views of a method of manufacturing a semiconductor device according to an embodiment of the present invention. The upper diagram of FIG. 1 is a top view of a method of manufacturing a semiconductor device, and the lower diagram of FIG. 1 is a cross-sectional view of the upper diagram along line AA'. As shown in FIG. 1, a substrate 110 is provided. The substrate 110 may include a plurality of material layers. In this embodiment, the substrate 110 may include a tungsten silicon layer 112, a silicon nitride layer 114, an oxide layer 116, an organic dielectric layer (ODL) 118 and a silicon-containing hard mask bottom anti-reflection coating (SHB) layer 119 stacked from bottom to top, but it is not limited thereto. A first patterned photoresist layer 10 is formed on the substrate 110. In this embodiment, the pattern of the first patterned photoresist layer 10 is night square photoresists arranged regularly, but it is not limited thereto.

Figure 2:
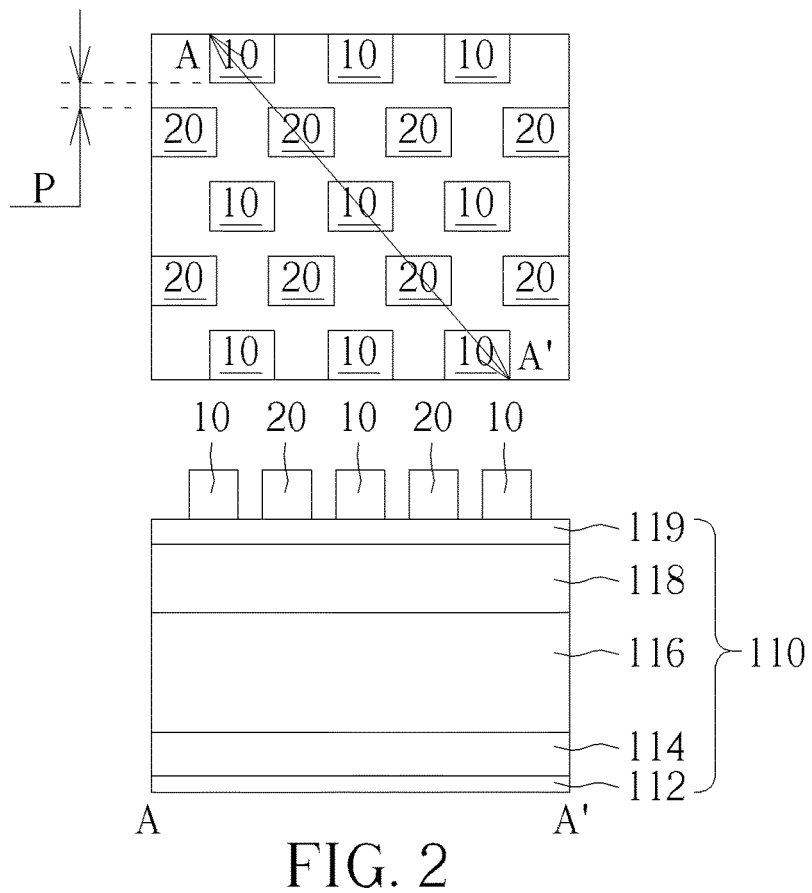
FIG. 2 schematically depicts a top view and a cross-sectional view of a method of manufacturing a semiconductor device according to an embodiment of the present invention.

The upper diagram of FIG. 2 is a top view of a method of manufacturing a semiconductor device, and the lower diagram of FIG. 2 is a cross-sectional view of the upper diagram along line AA'. As shown in FIG. 2, a second patterned photoresist layer 20 is formed on the substrate 110 after the first patterned photoresist layer 10 is formed on the substrate 110. In this embodiment, the first patterned photoresist layer 10 and the second patterned photoresist layer 20 are arranged alternatively, but it is not restricted thereto. The photoresist layers are formed several times (respectively), thereby gaps between patterns of the photoresist layers being shrunk. For instance, minimum distances P between patterns of the first patterned photoresist layer 10 and patterns of the second patterned photoresist layer 20 are less than minimum distances between patterns of the first patterned photoresist layer 10 and minimum distances between patterns of the second patterned photoresist layer 20.

Figure 3:
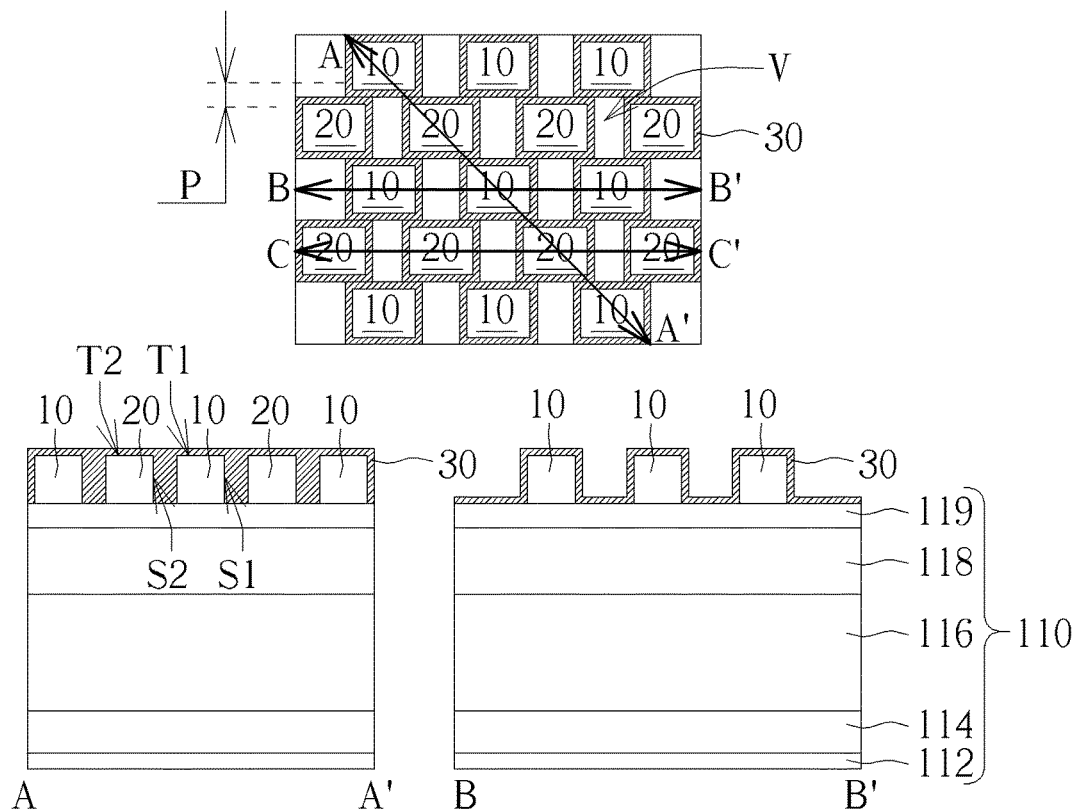
FIG. 3 schematically depicts a top view and cross-sectional views of a method of manufacturing a semiconductor device according to an embodiment of the present invention.

The upper diagram of FIG. 3 is a top view of a method of manufacturing a semiconductor device, the left and lower diagram of FIG. 3 is a cross-sectional view of the upper diagram along line AA' and the right and lower diagram of FIG. 3 is a cross-sectional view of the upper diagram along line BB'. As shown in FIG. 3, a liner 30 is formed to cover sidewalls of the first patterned photoresist layer 10 and the second patterned photoresist layer 20. In this embodiment, the liner 30 covers sidewalls S1 and top surfaces T1 of the first patterned photoresist layer 10, and sidewalls S2 and top surfaces T2 of the second patterned photoresist layer 20. In another embodiment, the liner 30 may only cover the sidewalls S1 of the first patterned photoresist layer 10, and the sidewalls S2 of the second patterned photoresist layer 20. That is, the liner 30 may blanketly cover the sidewalls S1 and the top surfaces T1 of the first patterned photoresist layer 10, and the sidewalls S2 and the top surfaces T2 of the second patterned photoresist layer 20, and then the liner 30 of the first patterned photoresist layer 10 and the second patterned photoresist layer 20 is removed except for the liner 30 covering the sidewalls S1 of the first patterned photoresist layer 10 and the sidewalls S2 covering the second patterned photoresist layer 20, depending upon practical requirements. By applying the present invention, gaps having minimum distances P between the first patterned photoresist layer 10 and the second patterned photoresist layer 20 are filled up by the liner 30 covering the sidewalls S1 of the first patterned photoresist layer 10 and the sidewalls S2 of the second patterned photoresist layer 20. Thus, a plurality of holes V surrounded by the liner 30 are formed. More precisely, the liner 30 covering two of the sidewalls S1 of the first patterned photoresist layer 10 and the liner 30 covering two of the corresponding sidewalls S2 of the second patterned photoresist layer 20 enclose each of the holes V, but it is not limited thereto. Compared to holes enclosed by the first patterned photoresist layer 10 and the second patterned photoresist layer 20 directly contacted to each other, patterns later formed by utilizing the liner 30 can be more precisely. In a preferred embodiment, the liner 30 may by formed by an atomic layer deposition (ALD) process, so that the liner 30 can be formed more accurately than the first patterned photoresist layer 10 and the second patterned photoresist layer 20 being formed by spin-coating. In one case, the liner 30 may be an oxide liner, but it is not limited thereto.

Figure 4:
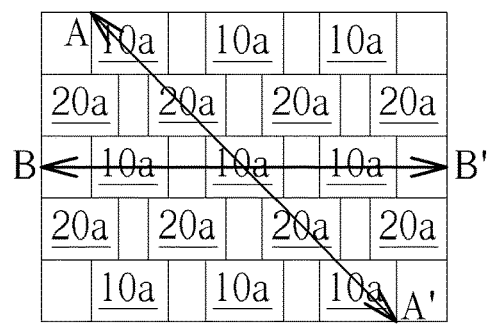
FIG. 4 schematically depicts a top view and cross-sectional views of a method of manufacturing a semiconductor device according to an embodiment of the present invention.
Figure 4:
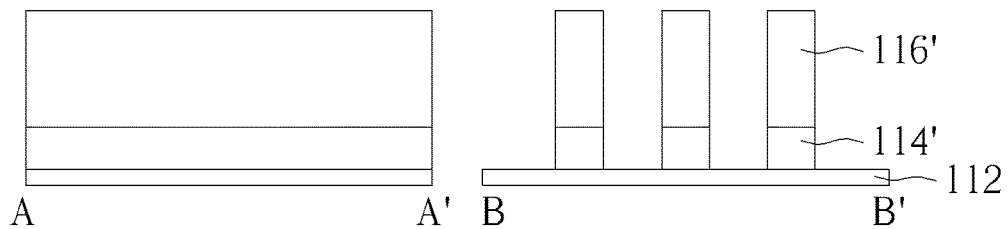

The upper diagram of FIG. 4 is a top view of a method of manufacturing a semiconductor device, the left and lower diagram of FIG. 4 is a cross-sectional view of the upper diagram along line AA', and the right and lower diagram of FIG. 4 is a cross-sectional view of the upper diagram along line BB'. The patterns of the first patterned photoresist layer 10, the second patterned photoresist layer 20 and the liner 30 are transferred into material layers in the substrate 110. In this embodiment, the patterns of the first patterned photoresist layer 10, the second patterned photoresist layer 20 and the liner 30 are transferred into material layers in the substrate 110 by several processes. As shown in FIG. 4, the patterns of the first patterned photoresist layer 10, the second patterned photoresist layer 20 and the liner 30 are transferred into the silicon nitride layer 114 and the oxide layer 116, to form a plurality of pillars 10a/20a, and each of the pillars 10a/20a includes a silicon nitride layer 114' and an oxide layer 116', wherein the tungsten silicon layer 112 is used as an etch stop layer while pattern transferring. The organic dielectric layer (ODL) 118 and the silicon-containing hard mask bottom anti-reflection coating (SHB) layer 119 on the silicon nitride layer 114 and the oxide layer 116 are hard masks during etching transferring processes, for transferring the patterns of the first patterned photoresist layer 10, the second patterned photoresist layer 20 and the liner 30 into the silicon nitride layer 114 and the oxide layer 116. Therefore, the organic dielectric layer (ODL) 118 and the silicon-containing hard mask bottom anti-reflection coating (SHB) layer 119 are removed while pattern transferring. Two embodiments of pattern transferring are presented in the following, but the present invention is not restricted thereto.

Only cross-sectional views are changed during pattern transferring steps, and thus cross-sectional views are only depicted in FIGS. 5-8 for simplifying.

Figure 5:
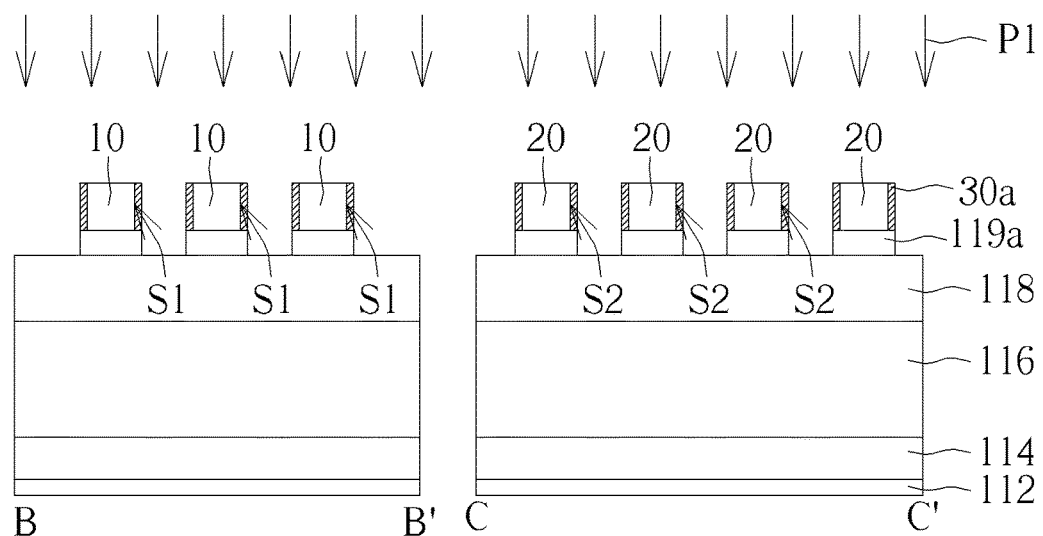
FIG. 5 schematically depicts cross-sectional views of a method of manufacturing a semiconductor device according to an embodiment of the present invention.

FIGS. 5-8 schematically depict cross-sectional views of a method of manufacturing a semiconductor device according to an embodiment of the present invention, wherein left diagrams of FIGS. 5-8 are cross-sectional views of FIG. 3 along line BB' and right diagrams of FIGS. 5-8 are cross-sectional views of FIG. 3 along line CC'. As shown in FIG. 5, a first etching process P1 is performed to remove the liner 30 of FIG. 3 covering the top surfaces T1 of the first patterned photoresist layer 10, the liner 30 of FIG. 3 covering the top surfaces T2 of the second patterned photoresist layer 20, and the liner 30 of FIG. 3 covering the silicon-containing hard mask bottom anti-reflection coating (SHB) layer 119 exposed by the first patterned photoresist layer 10 and the second patterned photoresist layer 20. Therefore, liners 30a covering the sidewalls S1 of the first patterned photoresist layer 10 only and covering the sidewalls S2 of the second patterned photoresist layer 20 only are reserved. The silicon-containing hard mask bottom anti-reflection coating (SHB) layer 119 exposed by the first patterned photoresist layer 10 and the second patterned photoresist layer 20 is also removed to form a silicon-containing hard mask bottom anti-reflection coating (SHB) layer 119a and expose a part of the organic dielectric layer (ODL) 118.

Figure 6:
FIG. 6 schematically depicts cross-sectional views of a method of manufacturing a semiconductor device according to an embodiment of the present invention.
Figure 6:
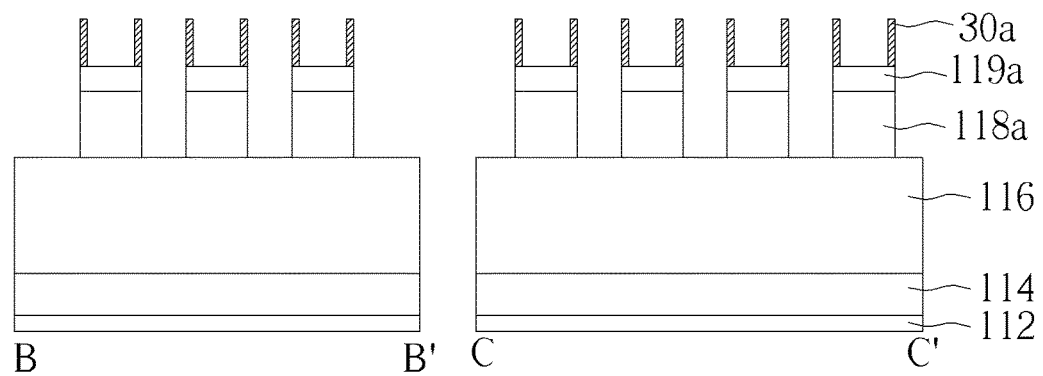

A second etching process P2 is performed to remove the organic dielectric layer (ODL) 118 exposed by the first patterned photoresist layer 10, the second patterned photoresist layer 20 and the silicon-containing hard mask bottom anti-reflection coating (SHB) layer 119, to form an organic dielectric layer (ODL) 118a and expose the oxide layer 116, as shown in FIG. 6.

Figure 7:
FIG. 7 schematically depicts cross-sectional views of a method of manufacturing a semiconductor device according to an embodiment of the present invention.
Figure 7:
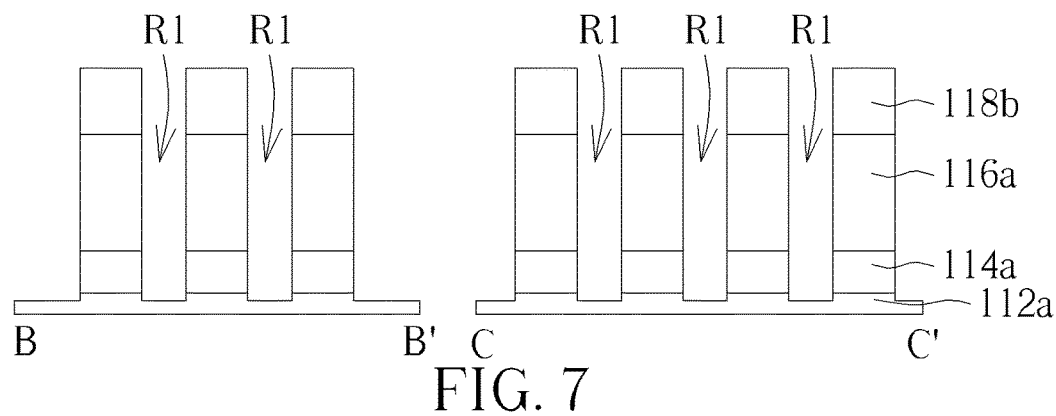

A third etching process P3 is performed to remove the oxide layer 116, the silicon nitride layer 114 and the tungsten silicon layer 112 exposed by the liners 30a, the silicon-containing hard mask bottom anti-reflection coating (SHB) layer 119a and the organic dielectric layer (ODL) 118a, to form an oxide layer 116a, a silicon nitride layer 114a and a tungsten silicon layer 112a, as shown in FIG. 7. In this embodiment, the tungsten silicon layer 112 is also etched to form recesses R1 while the third etching process P3 is performed, thereby the tungsten silicon layer 112a having a plurality of inverted T-shaped cross-sectional profiles. Moreover, the liner 30a and the silicon-containing hard mask bottom anti-reflection coating (SHB) layer 119a having similar materials to the oxide layer 116 and the silicon nitride layer 114 are also removed while the oxide layer 116 and the silicon nitride layer 114 are etched, but only a part 118a of the organic dielectric layer (ODL) 118 is removed while an organic dielectric layer (ODL) 118b is reserved.

Figure 8:
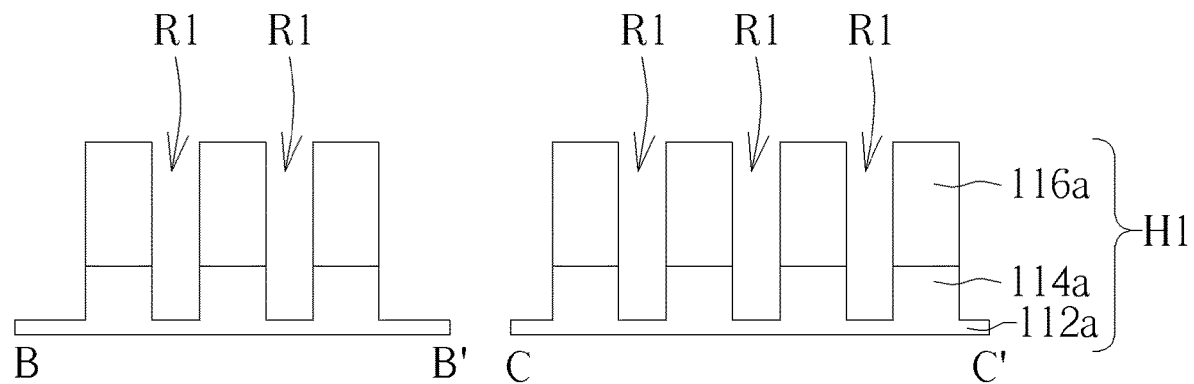
FIG. 8 schematically depicts cross-sectional views of a method of manufacturing a semiconductor device according to an embodiment of the present invention.

Thereafter, the organic dielectric layer (ODL) 118b is removed to form a hard mask H1, as shown in FIG. 8. The hard mask H1 includes the tungsten silicon layer 112a, the silicon nitride layer 114a and the oxide layer 116a stacked from bottom to top. The hard mask H1 may be a storage node hard mask of a capacitor, but it is not limited thereto. In the present invention, photoresist layers are formed sequentially, a liner surrounds the photoresist layers to form a pattern layer, and then the pattern of the pattern layer is transferred to material layers such as hard mask layers. In this way, gaps between patterns in the pattern layer can be shrunk and the pattern precision can be improved.

Figure 9:
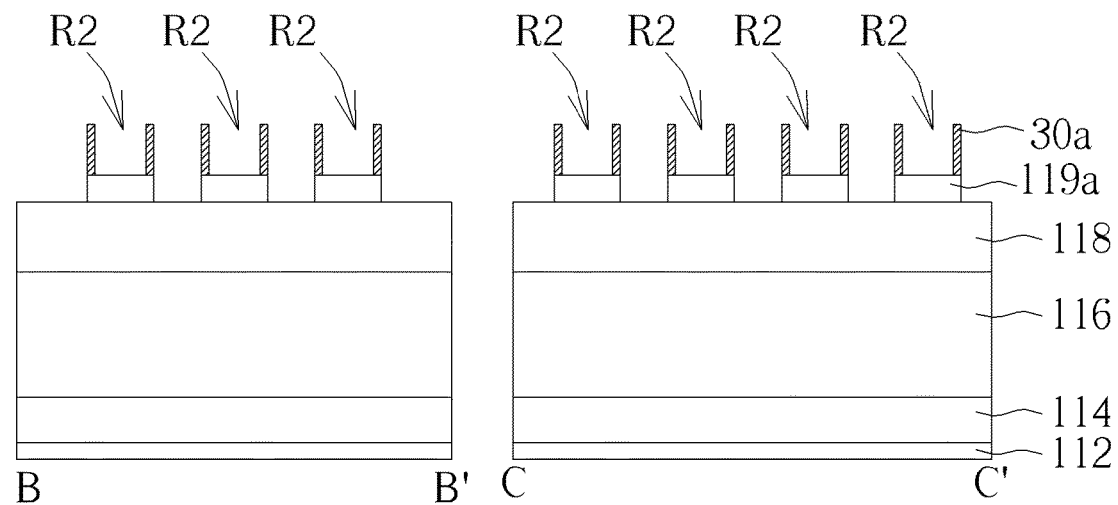
FIG. 9 schematically depicts cross-sectional views of a method of manufacturing a semiconductor device according to another embodiment of the present invention.
Figure 10:
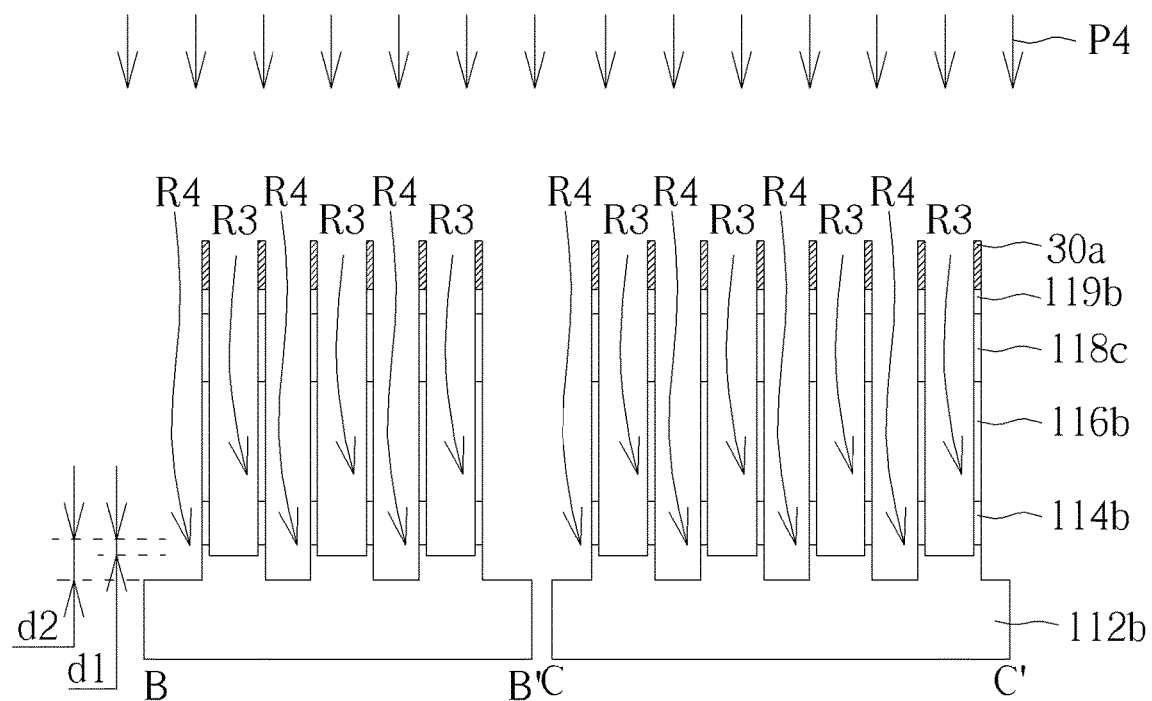
FIG. 10 schematically depicts cross-sectional views of a method of manufacturing a semiconductor device according to another embodiment of the present invention.
Figure 11:
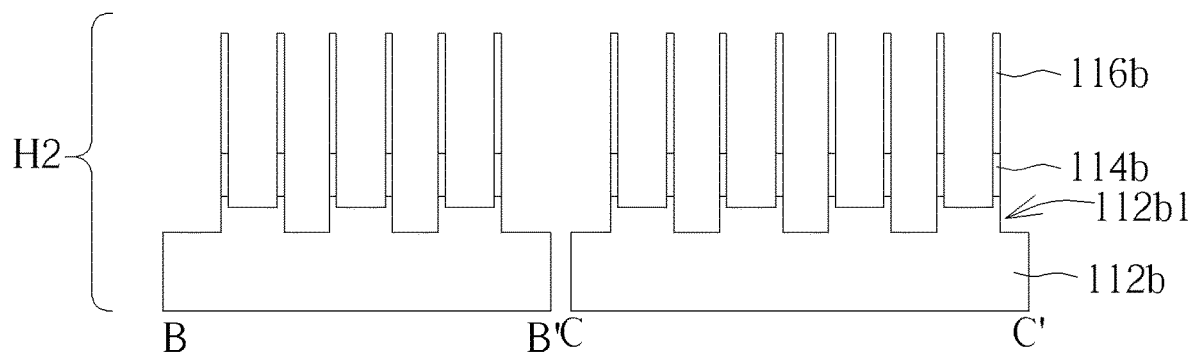
FIG. 11 schematically depicts cross-sectional views of a method of manufacturing a semiconductor device according to another embodiment of the present invention.

FIGS. 9-11 schematically depict cross-sectional views of a method of manufacturing a semiconductor device according to another embodiment of the present invention. In another embodiment, after the first etching process P1 of FIG. 5 is performed, the first patterned photoresist layer 10 and the second patterned photoresist layer 20 are removed and thus recesses R2 are formed between the liners 30a, as shown in FIG. 9.

An etching process P4 is performed to remove the silicon-containing hard mask bottom anti-reflection coating (SHB) layer 119a, the organic dielectric layer (ODL) 118, the oxide layer 116, the silicon nitride layer 114 and the tungsten silicon layer 112 exposed by the liners 30a, thereby first recesses R3 and second recesses R4 can being formed in the tungsten silicon layer 112, as shown in FIG. 10. By doing this, a tungsten silicon layer 112b, a silicon nitride layer 114b, an oxide layer 116b, an organic dielectric layer (ODL) 118c and a silicon-containing hard mask bottom anti-reflection coating (SHB) layer 119b stacked from bottom to top can be formed, wherein depths d1 of the first recesses R3 are less than depths d2 of the second recesses R4. In one case, the first recesses R3 and the second recesses R4 are arranged alternatively.

Figure 12:
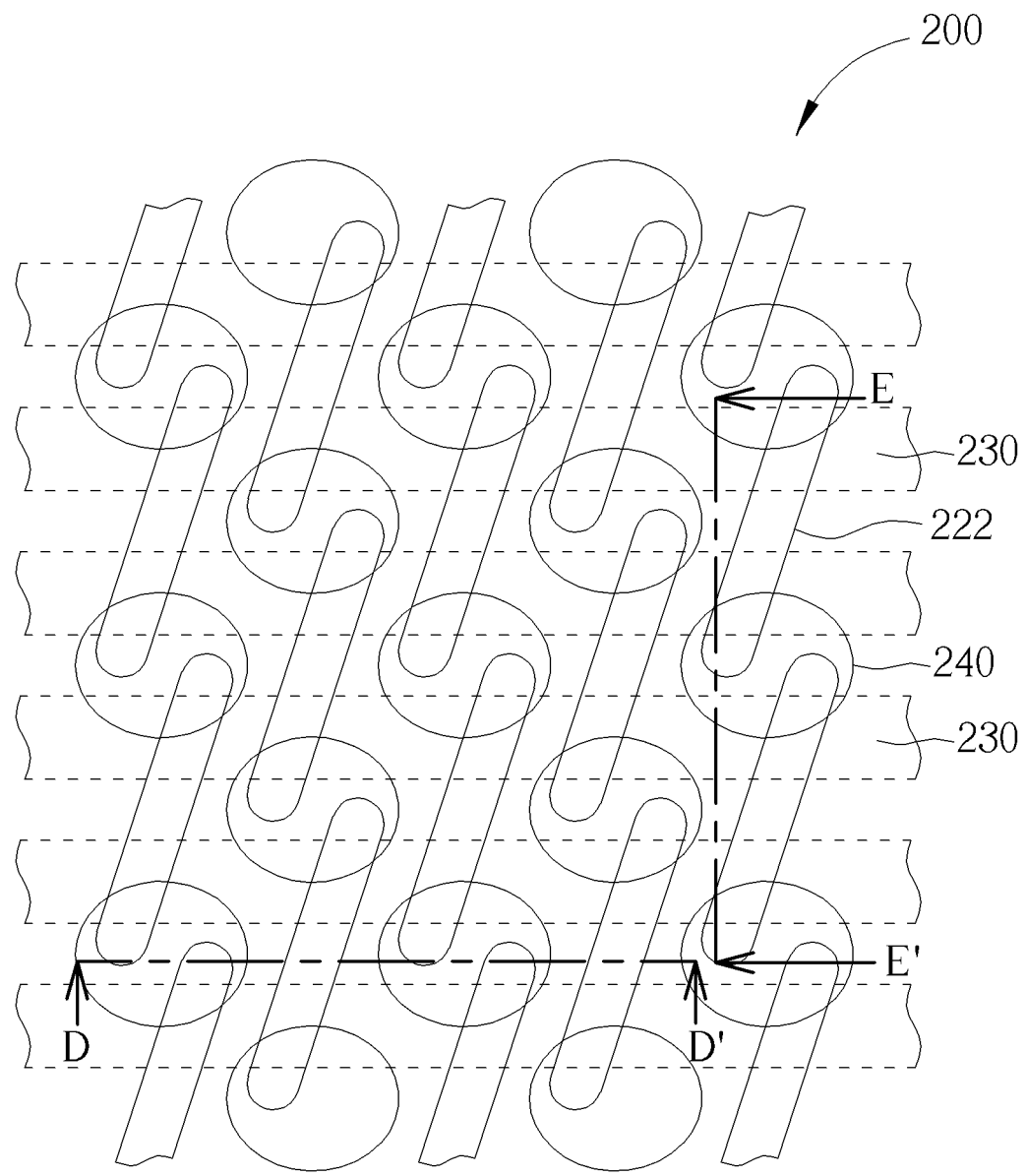
FIG. 12 schematically depicts a top view of a method of manufacturing a memory cell according to an embodiment of the present invention.
Figure 13:
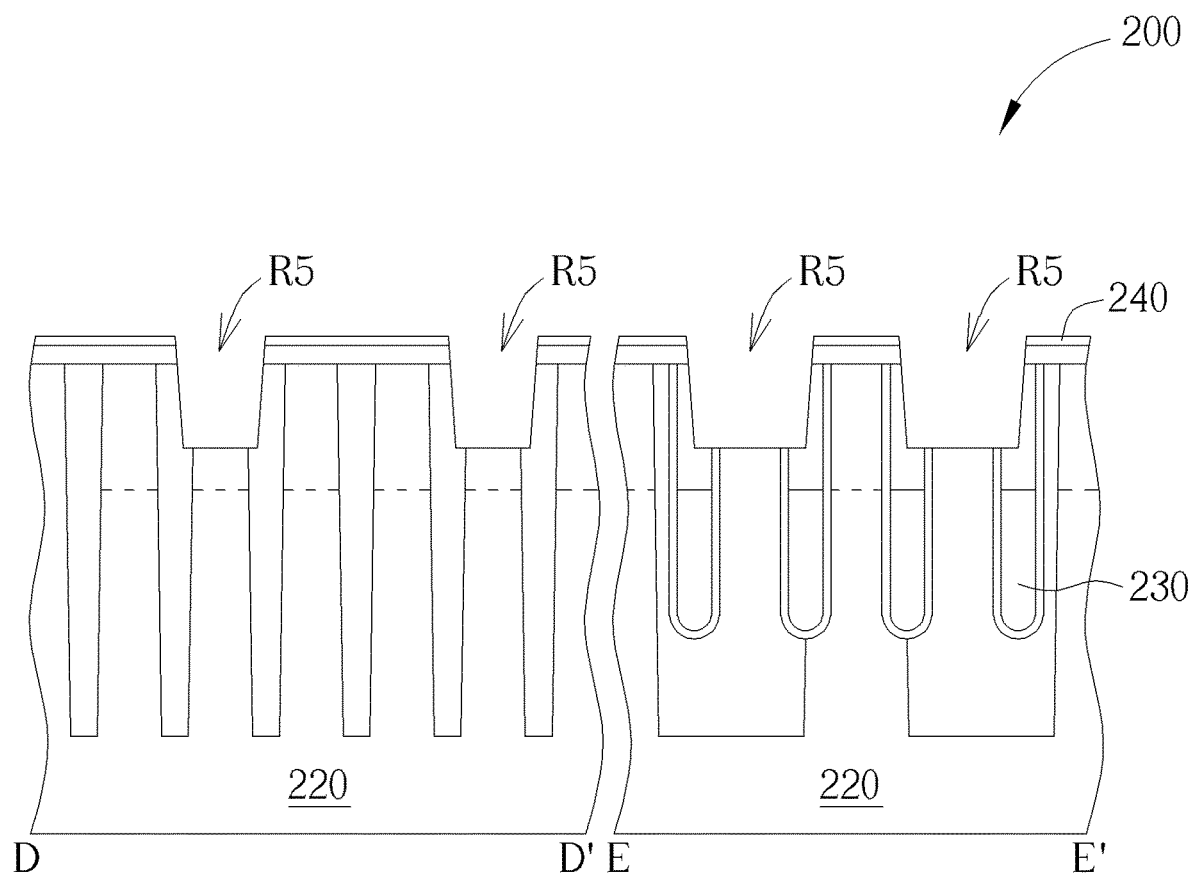
FIG. 13 schematically depicts cross-sectional views of FIG. 12 along line DD' and line EE'.

The present invention may be applied to form a memory cell 200 as shown in FIGS. 12-13. FIG. 12 schematically depicts a top view of a method of manufacturing a memory cell according to an embodiment of the present invention. FIG. 13 schematically depicts cross-sectional views of FIG. 12 along line DD' and line EE'. FIGS. 12-13 depict a substrate 220, active parts 222 in the substrate 220, word lines 230 embedded in the substrate 220, a mask layer 240 on the substrate 220, and recesses R5 in the mask layer 240. The tungsten silicon layer 112b of FIG. 10 may correspond to the mask layer 240 of FIGS. 12-13 on the substrate 220. Methods of forming the first recesses R3 or/and the second recesses R4 of FIG. 10 may be applied to form the recesses R5 of the memory cell 200 of FIGS. 12-13. The substrate 220 may be a silicon layer, a nitride layer and an oxide layer stacked from bottom to top, but it is not limited thereto.

Figure 14:
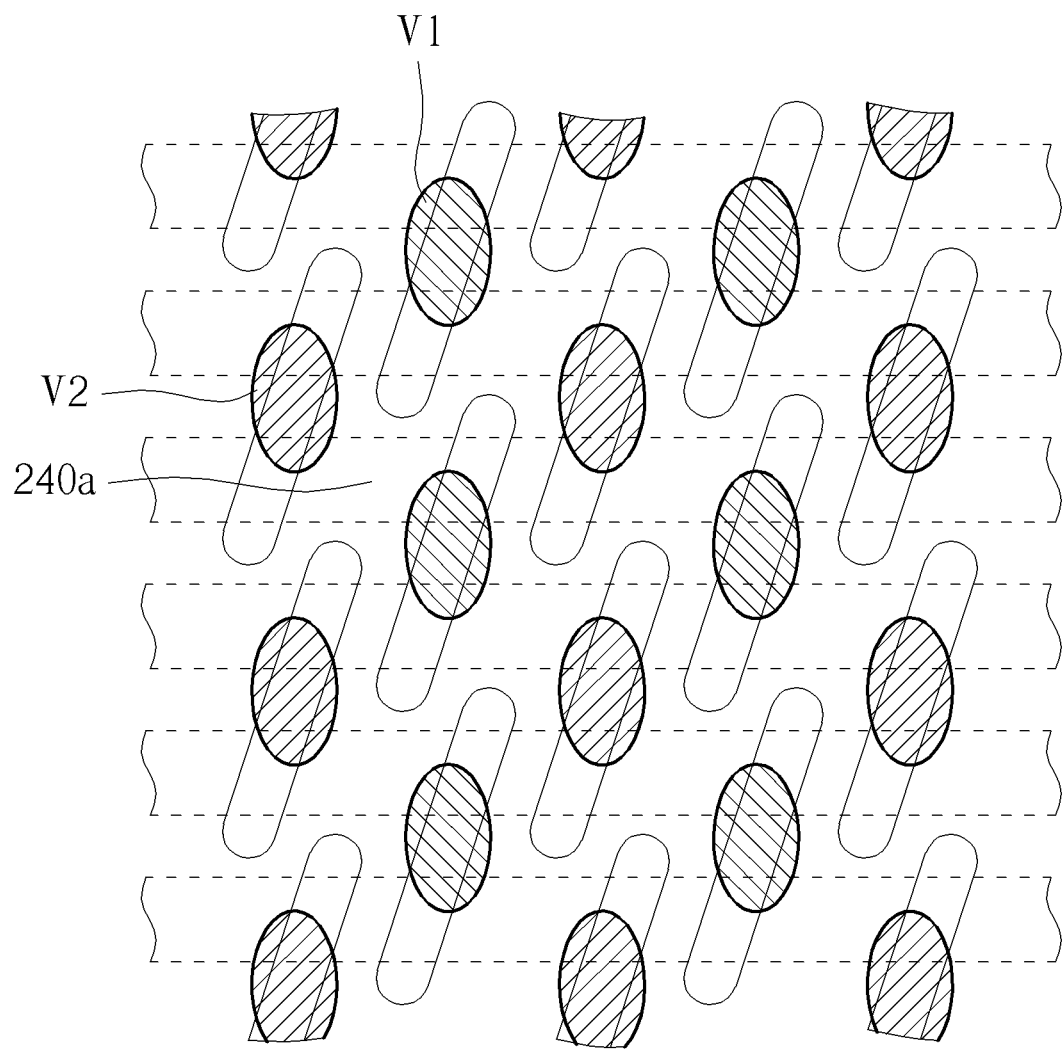
FIG. 14 schematically depicts a top view of a method of manufacturing a memory cell according to an embodiment of the present invention.

A structure opposite to the structure of FIG. 12 may be formed. FIG. 14 schematically depicts a top view of a method of manufacturing a memory cell according to an embodiment of the present invention. As shown in FIG. 14, the mask layer 240 of FIG. 12 is replaced by holes V1 and holes V2, and the recesses R5 in the mask layer 240 of FIG. 12 are replaced by a mask layer 240a. In this way, a plurality of hole structures are formed, wherein the hole structures may include the holes V1 and the holes V2, and the depths of the holes V1 are different from the depths of the holes V2. For example, the depths of the holes V1 are less than the depths of the holes V2, but it is not limited thereto. A bottom of each of the hole structures exposes at least two different materials, wherein the materials of the bottom of each of the hole structures may include silicon, silicon oxide or/and silicon nitride.

Figure 15:
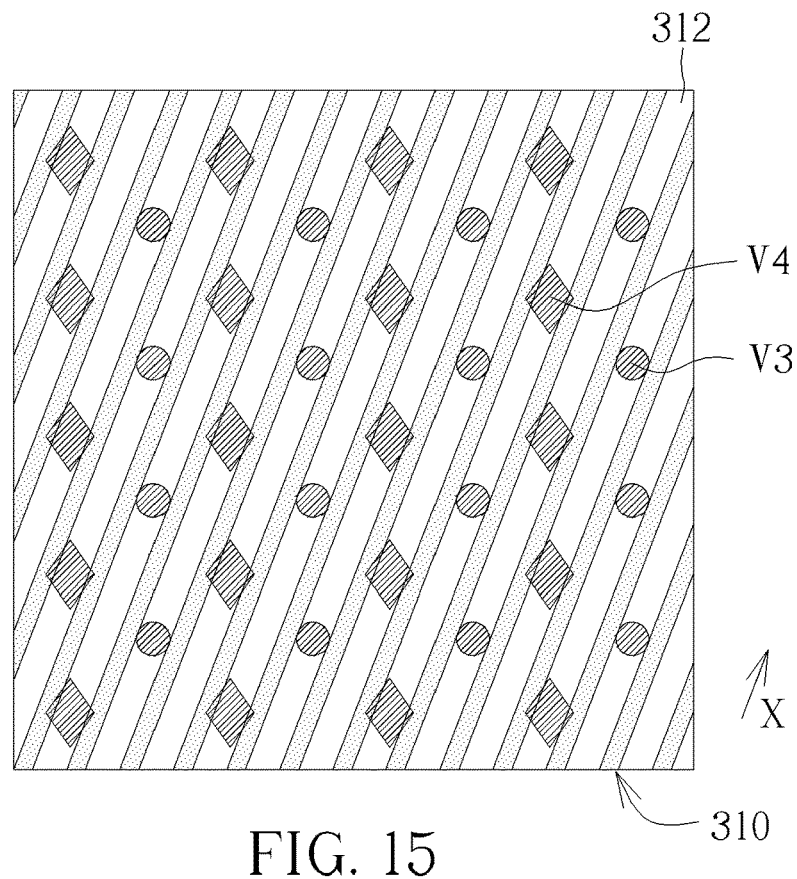
FIG. 15 schematically depicts a top view of a substrate structure.

Otherwise, the present invention may be applied to a layout of FIG. 15. A substrate 310 may include a plurality of line patterns 312, wherein the line patterns 312 extend along a direction x. The substrate 310 may include a silicon layer and an oxide layer stacked from bottom to top, but it is not limited thereto. The cross-sectional view of FIG. 10 may correspond to the cross-sectional view along the direction x, wherein the first recesses R3 and the second recesses R4 of FIG. 10 may correspond to the holes V3 and the holes V4, and the shapes of the openings of the holes V3 are different from the shapes of the openings of the holes V4. The depths of the holes V1 are different from the depths of the holes V2, depending upon practical requirements.

Figure 16:
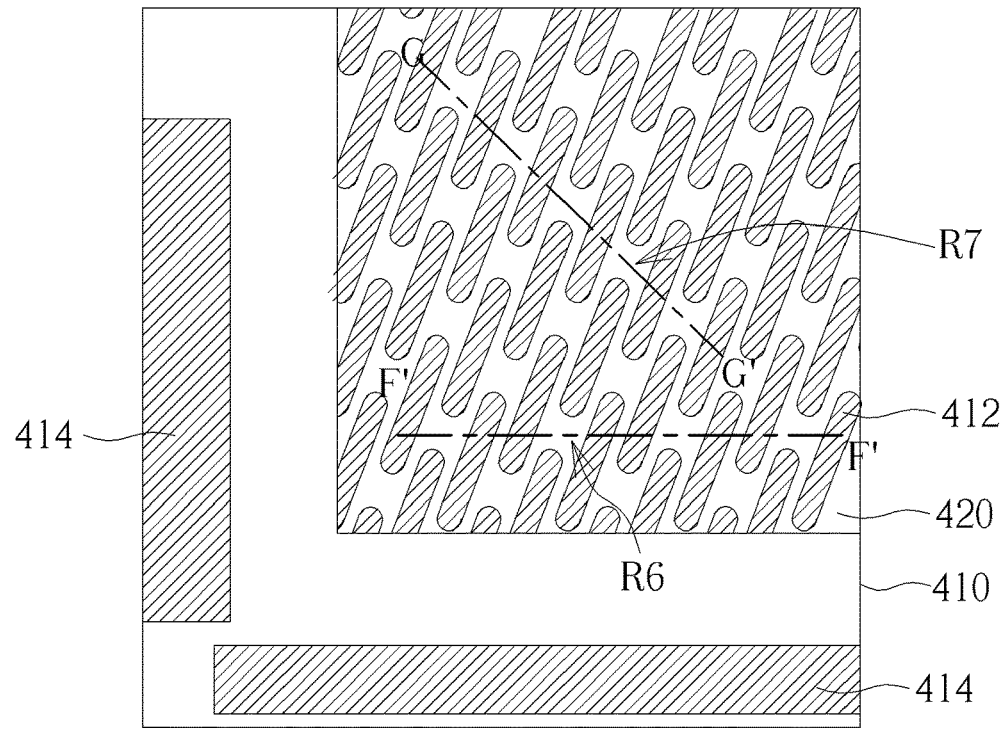
FIG. 16 schematically depicts a top view of a substrate structure.

FIG. 16 schematically depicts a top view of a substrate structure. As shown in FIG. 16, a substrate 410 may include active areas 412 and active areas 414, wherein the active areas 412 may be a plurality of protruding islands, and each of the protruding islands may be isolated from an isolation layer (a location 420 of forming the isolation layer). The cross-sectional view of FIG. 10 may correspond to the cross-sectional view along line FF' or the cross-sectional view along line GG', wherein the first recesses R3 and the second recesses R4 of FIG. 10 may correspond to the recesses R6 or the recesses R7 between the active areas 412, depending upon practical requirements.

The liners 30a, the silicon-containing hard mask bottom anti-reflection coating (SHB) layer 119b and the organic dielectric layer (ODL) 118c are removed as shown in FIG. 11, thereby forming a hard mask H2, wherein the hard mask H2 includes the tungsten silicon layer 112b, the silicon nitride layer 114b and the oxide layer 116b stacked from bottom to top. More precisely, the hard mask H2 may include a plurality of pillars, and each of the pillars may include a protruding part 112b1 of the tungsten silicon layer 112b, the silicon nitride layer 114b and the oxide layer 116b. The hard mask H2 may be a storage node hard mask of a capacitor, but it is not limited thereto. In the present invention, photoresist layers are sequentially formed, and then a liner surrounds these photoresist layers to form a pattern layer, and then the pattern layer is transferred into material layers such as a hard mask layer. In this way, gaps between patterns of the pattern layer can be shrunk, and pattern precision can be increased.

To summarize, the present invention provides a semiconductor device and manufacturing method thereof, which forms a first patterned photoresist layer and a second patterned photoresist layer on a substrate sequentially, and then forms a liner covering sidewalls of the first patterned photoresist layer and the second patterned photoresist layer. In this way, the patterns of the first patterned photoresist layer, the second patterned photoresist layer and the liner, or the patterns of the liner (after the first patterned photoresist layer the second patterned photoresist layer are removed) can be transferred into lower material layers. Pattern precision can be increased by forming photoresists many times (or respectively) and etching once. Furthermore, patterns in the lower material layers can be formed more precisely than only coating photoresists by forming the liner surrounding the first patterned photoresist layer and the second patterned photoresist layer, hence further increasing pattern precision. Preferably, the liner may be formed by an atomic layer deposition (ALD) process, but it is not limited thereto.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of manufacturing a semiconductor device, comprising:
   forming a first patterned photoresist layer on a substrate;
   forming a second patterned photoresist layer on the substrate after the first patterned photoresist layer is formed, wherein the first patterned photoresist layer and the second patterned photoresist layer are arranged alternatively;
   forming a liner covering sidewalls of the first patterned photoresist layer and the second patterned photoresist layer, wherein a plurality of holes are surrounded by the liner, and the liner covering two of the sidewalls of the first patterned photoresist layer and the liner covering two of the corresponding sidewalls of the second patterned photoresist layer enclose each of holes.

2. The method of manufacturing a semiconductor device according to claim 1, wherein the liner covers the sidewalls and top surfaces of the first patterned photoresist layer and the second patterned photoresist layer.

3. The method of manufacturing a semiconductor device according to claim 1, wherein the liner comprises an oxide liner.

4. The method of manufacturing a semiconductor device according to claim 1, wherein the liner is formed by an atomic layer deposition (ALD) process.

5. The method of manufacturing a semiconductor device according to claim 1, wherein the substrate comprises a tungsten silicon layer, a silicon nitride layer, an oxide layer, an organic dielectric layer (ODL) and a silicon-containing hard mask bottom anti-reflection coating (SHB) layer stacked from bottom to top.

6. The method of manufacturing a semiconductor device according to claim 5, further comprising:
   performing a first etching process to remove a part of the liner covering top surfaces of the first patterned photoresist layer, the second patterned photoresist layer, and the silicon-containing hard mask bottom anti-reflection coating (SHB) layer, and remove a part of the silicon-containing hard mask bottom anti-reflection coating (SHB) layer exposed by the first patterned photoresist layer and the second patterned photoresist layer, but reserve the other part of the liner covering the sidewalls of the first patterned photoresist layer and the second patterned photoresist layer.

7. The method of manufacturing a semiconductor device according to claim 6, further comprising:
   performing a second etching process to remove the first patterned photoresist layer, the second patterned photoresist layer, and the organic dielectric layer (ODL) exposed by the silicon-containing hard mask bottom anti-reflection coating (SHB) layer.

8. The method of manufacturing a semiconductor device according to claim 7, further comprising:
   performing a third etching process to remove the liner, the silicon-containing hard mask bottom anti-reflection coating (SHB) layer, and a part of the oxide layer and a part of the silicon nitride layer exposed by the organic dielectric layer (ODL).

9. The method of manufacturing a semiconductor device according to claim 8, wherein the tungsten silicon layer is etched to form recesses while performing the third etching process.

10. The method of manufacturing a semiconductor device according to claim 6, further comprising:
    removing the first patterned photoresist layer and the second patterned photoresist layer after the first etching process is performed.

11. The method of manufacturing a semiconductor device according to claim 10, further comprising
    performing an etching process to remove a part of the silicon-containing hard mask bottom anti-reflection coating (SHB) layer, a part of the organic dielectric layer (ODL), a part of the oxide layer, a part of the silicon nitride layer and a part of the tungsten silicon layer exposed by the liner, thereby first recesses and second recesses being formed in the tungsten silicon layer, wherein the depths of the first recesses are less than the depths of the second recesses.

* * * * *